United States Patent
Boschke et al.

(10) Patent No.: US 8,846,467 B1
(45) Date of Patent: Sep. 30, 2014

(54) SILICIDATION OF SEMICONDUCTOR DEVICES

(71) Applicant: GLOBALFOUNDRIES Inc., Grand Cayman, KY (US)

(72) Inventors: Roman Boschke, Dresden (DE); Stefan Flachowsky, Dresden (DE); Matthias Kessler, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/021,525

(22) Filed: Sep. 9, 2013

(51) Int. Cl.
*H01L 21/8238* (2006.01)

(52) U.S. Cl.
USPC ........... 438/199; 438/183; 438/215; 438/655; 438/725; 438/780; 257/368; 257/384; 257/E21.409; 257/E21.632; 257/E27.062

(58) Field of Classification Search
None
See application file for complete search history.

(56) References Cited

U.S. PATENT DOCUMENTS

| | | | | |
|---|---|---|---|---|
| 8,664,057 | B2 * | 3/2014 | Pal et al. | 438/199 |
| 2007/0057331 | A1 * | 3/2007 | Satou et al. | 257/384 |
| 2010/0087038 | A1 * | 4/2010 | Chung et al. | 438/199 |
| 2010/0330757 | A1 * | 12/2010 | Lenski et al. | 438/229 |
| 2010/0330808 | A1 * | 12/2010 | Richter et al. | 438/691 |
| 2011/0127613 | A1 * | 6/2011 | Beyer et al. | 257/369 |
| 2011/0186931 | A1 * | 8/2011 | Marxsen et al. | 257/368 |

\* cited by examiner

*Primary Examiner* — Zandra Smith
*Assistant Examiner* — Khanh Duong
(74) *Attorney, Agent, or Firm* — Amerson Law Firm, PLLC

(57) ABSTRACT

A method for performing silicidation of a gate electrode is provided that includes forming both a first transistor with a first gate electrode covered by a cap layer and a semiconductor device on the same semiconductor substrate, forming an organic planarization layer (OPL) on the first transistor and the semiconductor device, back etching the OPL such that an upper surface of the OPL is positioned at a level that is below a level of an upper surface of the cap layer, forming a mask layer covering the semiconductor device without covering the first transistor, removing the cap layer while the back-etched OPL and the mask layer are present, and performing silicidation of the first gate electrode.

16 Claims, 5 Drawing Sheets

SILICIDATION OF SEMICONDUCTOR DEVICES

BACKGROUND OF THE INVENTION

1. Field of the Invention

Generally, the present disclosure relates to the field of integrated circuits and semiconductor devices, and, more particularly, to the silicidation of elements of semiconductor devices, for example, gate electrodes of transistor devices, in the context of integrated formation of a variety of semiconductor devices.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout. In a wide variety of electronic circuits, field effect transistors represent one important type of circuit element that substantially determines performance of the integrated circuits. Generally, a plurality of process technologies are currently practiced for forming field effect transistors, wherein, for many types of complex circuitry, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer.

A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed between the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a given extension of the channel region in the transistor width direction, the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length is a dominant design criterion for accomplishing an increase in the operating speed of the integrated circuits.

In sophisticated transistor elements, a plurality of features finally determine the overall performance of the transistor, wherein a complex mutual interaction of these factors may be difficult to assess such that a wide variety of performance variations may be observed for a given basic transistor configuration. For example, the conductivity of doped silicon-based semiconductor regions may be increased by providing a metal silicide therein in order to reduce overall sheet resistance and contact resistivity. For example, the drain and source regions may receive a metal silicide, such as nickel silicide, nickel platinum silicide and the like, thereby reducing the overall series resistance of the conductive path between the drain and source terminals and the intermediate channel region. Similarly, a metal silicide may typically be formed in the gate electrode, which may comprise polysilicon material, thereby enhancing conductivity and thus reducing signal propagation delay. Although an increased amount of metal silicide in the gate electrode may per se be desirable in view of reducing the overall resistance thereof, a substantially complete silicidation (salicidation) of the polycrystalline silicon material down to the gate dielectric material may not be desirable in view of threshold voltage adjustment of the corresponding transistor element. It may, therefore, be desirable to maintain a certain portion of the doped polysilicon material in direct contact with the gate dielectric material so as to provide well-defined electronic characteristics in the channel region, so as to avoid significant threshold variations, which may be caused by a substantially full silicidation within portions of the gate electrode.

On the other hand, in some aggressively scaled transistor elements, which may have channel lengths on the order of approximately 10-20 nm or less, gate structures that include a so-called high-k dielectric gate insulation layer and one or more metal layers that function as the gate electrode have been implemented that provide significantly enhanced operational characteristics over the heretofore more traditional silicon dioxide/polysilicon gate structure configurations.

In principle, there are two well-known processing methods for forming a planar or 3D transistor with a high-k/metal gate (HK/MG) structure: (1) the so-called "gate last" or "replacement gate" technique; and (2) the so-called "gate first" technique. In the replacement gate technique, a so-called "dummy" or sacrificial gate structure is initially formed and remains in place as many process operations are performed to form the device, e.g., the formation of doped source/drain regions, performing an anneal process to repair damage to the substrate caused by the ion implantation processes and to activate the implanted dopant materials. At some point in the process flow, the sacrificial gate structure is removed to define a gate cavity where the final HK/MG gate structure for the device is formed. In general, using the "gate first" technique involves forming a stack of layers of material across the substrate, wherein the stack of materials includes a high-k gate insulation layer, one or more metal layers, a layer of polysilicon and a protective cap layer, e.g., silicon nitride. Thereafter, one or more etching processes are performed to pattern the stack of materials to thereby define the basic gate structures for the transistor devices.

An example of a conventional gate last processing is illustrated in FIG. 1. In the processing stage shown, a semiconductor device comprises a replacement gate 1 covered by a cap layer 2 that was used for patterning the layer from which the replacement gate 1 was formed. The cap layer 2 may be a nitride layer, for example. Sidewall spacers 3 are formed at sides of the replacement gate. Source/drain regions 4 are formed adjacent to the sidewall spacers 3. Next, an inter-layer dielectric (ILD) 5 is formed above the structure and, after planar back polishing, the structure shown in the penultimate sketch of FIG. 1 results. Subsequently, the replacement gate 1 can be removed and a high-k layer 6 and gate electrode 7 can be formed between the sidewall spacers 3.

An example of a conventional gate first processing is illustrated in FIG. 2. A stack of layers of material across the substrate is formed, wherein the stack of materials, in principle, may include a high-k gate isolation layer, one or more metal layers, a layer of polysilicon, and a protective cap layer, for example, silicon nitride. One or more etching processes are performed to pattern the stack of materials to thereby define the basic gate structures for the transistor devices. As shown at the top of FIG. 2, the gate structure comprises a gate electrode 10, cap layer 12 and sidewall spacers 13. The structure may comprise a high-k gate isolation layer (not shown) and the gate electrode 10 may comprise one or more metal layers and a layer of polysilicon. The protective cap layer 12 and the spacers 13 were formed to protect the gate structures from subsequent processing operations after the gates were patterned. Ion implantation in the context of an embedded SiGe sequence can be carried out in order to form source and drain regions. Subsequently, the protective cap layer 12 must be removed such that a metal silicide region 16 may be formed in the polysilicon gate material of the gate 10 so as to thereby reduce its contact resistance. In principle, a relatively thin layer of silicon dioxide may be deposited across the structure in order to protect the sidewall spacer 13 when the gate cap layer 12 is removed. After removal of the cap layer 12, silicidation is performed that results both in the metal silicide region 16 of the gate and silicidated source/drain regions 14.

It is important to note that, in general, the formation of transistor devices is part of an overall integrated processing of a variety of devices, such as transistors, fuses, resistors, etc. For example, also shown in FIG. 2 is an additional semiconductor device 18, for example, a polysilicon resistor, that has to be protected against silicidation by means of a protection (silicidation block) layer 15 formed by lithographic and etching processes.

However, in the gate last processing shown in FIG. 1, the cap layer has to be removed with a polish process. Consequently, formation of silicidated fuses formed in common fuse integration is not possible, but rather it is necessary to form vias or metal fuses, which complicated the overall formation of a finally resulting semiconductor device.

In the gate first processing shown in FIG. 2, on the other hand, the cap layer is to be removed in order to ensure gate silicidation. However, in parallel, unsilicidated other devices, such as polysilicon resistors, for example, have to be formed in a similar way as gate electrodes. Therefore, after removal of the cap layer 12 in order to allow for silicidation of the gate, an additional protection layer 15 has to be formed over resistor structures 18, thereby complicating the overall processing.

In view of the situation described above, the present disclosure provides techniques that allow for the silicidation of some devices without silicidation of other devices in the context of integrated formation of semiconductor devices without the need for complex overall processing.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative method for silicidation of a gate electrode (within a gate first processing) includes: (a) forming both a first transistor with a first gate electrode covered by a cap layer and a semiconductor device on the same semiconductor substrate; (b) forming an organic planarization layer (OPL) on the first transistor and the semiconductor device; (c) back etching the OPL such that an upper surface of the OPL is positioned at a level that is below a level of an upper surface of the cap layer (the upper surface of the cap layer is a free surface, whereas a lower surface of the cap layer is in contact with the first gate electrode); (d) forming a mask layer covering the semiconductor device without covering the first transistor; (e) removing the cap layer while the back-etched OPL and the mask layer are present; and (f) performing silicidation of the first gate electrode. It is noted that the first transistor may also comprise a high-k gate dielectric. The first gate electrode may comprise one or more metal layers and a polysilicon layer.

It is also provided a method including: (a) forming both a first structure comprising a layer comprising polysilicon covered by a cap layer and a semiconductor device on the same semiconductor substrate; (b) forming an organic planarization layer (OPL) on the first structure and the semiconductor device; (c) back etching the OPL such that an upper surface of the OPL is positioned at a level that is below a level of an upper surface of the cap layer; (d) forming a mask layer covering the semiconductor device and exposing the first structure; (e) removing the cap layer while the back-etched OPL and the mask layer are present; and (f) performing a step of silicidation.

By the step of silicidation, a silicidated polysilicon fuse may be formed from the first structure. Alternatively, the layer comprising polysilicon may be removed and replaced by a gate electrode after removal of the cap layer and before silicidation. In this case, silicidation of a gate electrode (and corresponding source/drain regions) in the context of a gate last processing is achieved. Thereby, a method for the manufacture of an integrated circuit can be provided.

BRIEF DESCRIPTION OF THE DRAWINGS

The disclosure may be understood by reference to the following description taken in conjunction with the accompanying drawings, in which like reference numerals identify like elements, and in which.

Figure 1:
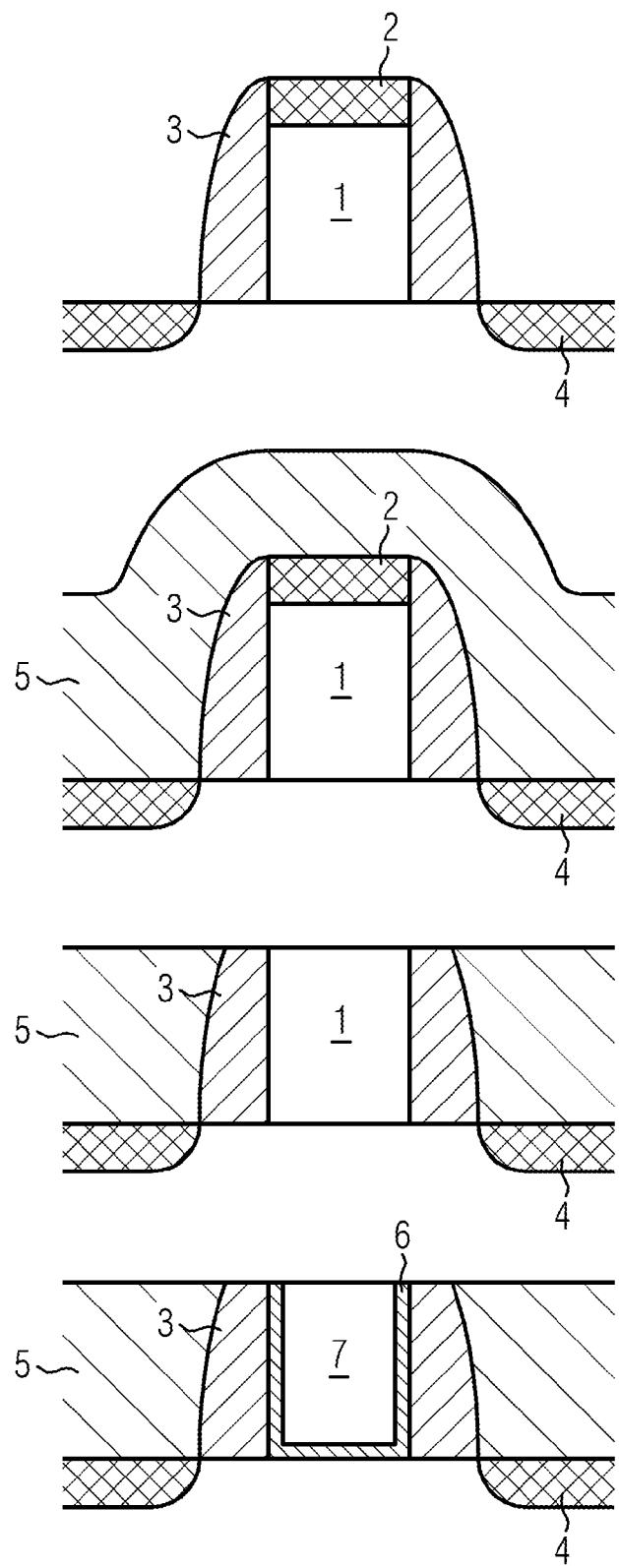
FIG. 1 illustrates a method for gate last processing according to the art.
Figure 2:
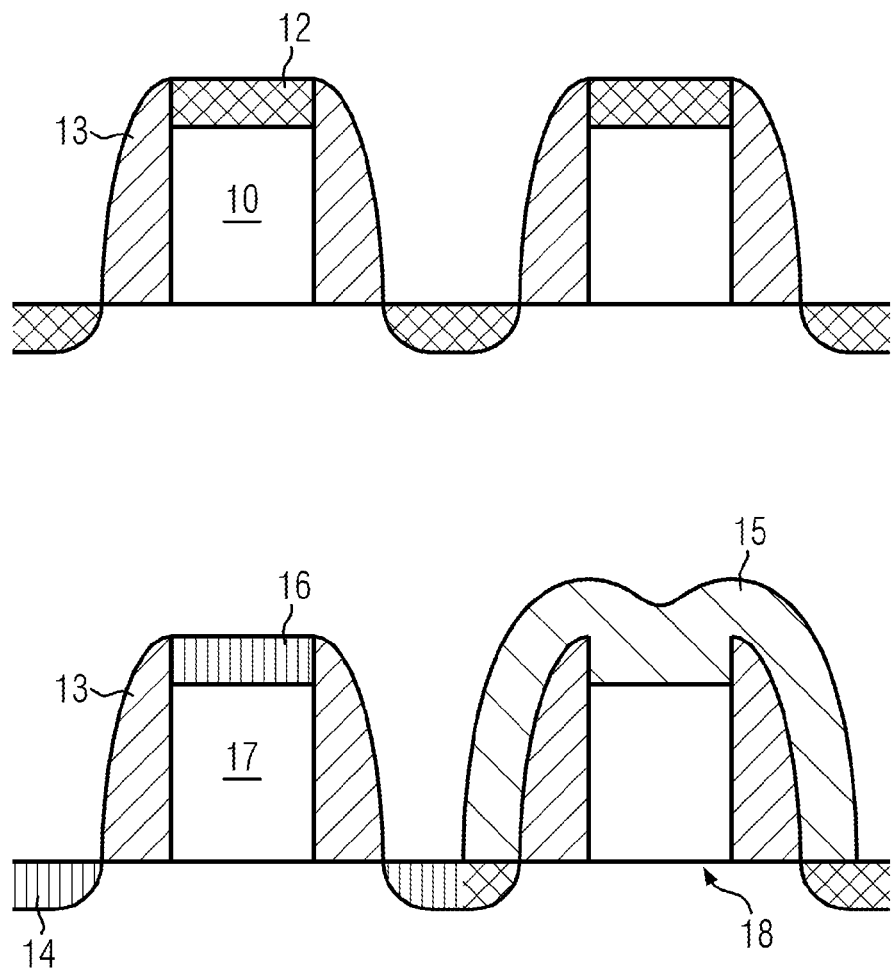
FIG. 2 illustrates a method for gate first processing according to the art.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

As will be readily apparent to those skilled in the art upon a complete reading of the present application, the present methods are applicable to a variety of technologies, e.g., NMOS, PMOS, CMOS, etc., and is readily applicable to a variety of devices, including, but not limited to, logic devices, memory devices, etc.

The present disclosure provides methods for silicidation of gate electrodes within integrated formation of a variety of semiconductor devices. In particular, the provided methods allow for the formation of silicidated and non-silicidated gates during the same processing scheme with less complexity as compared to the art. The methods comprise gate last and gate first processing.

Figure 3:
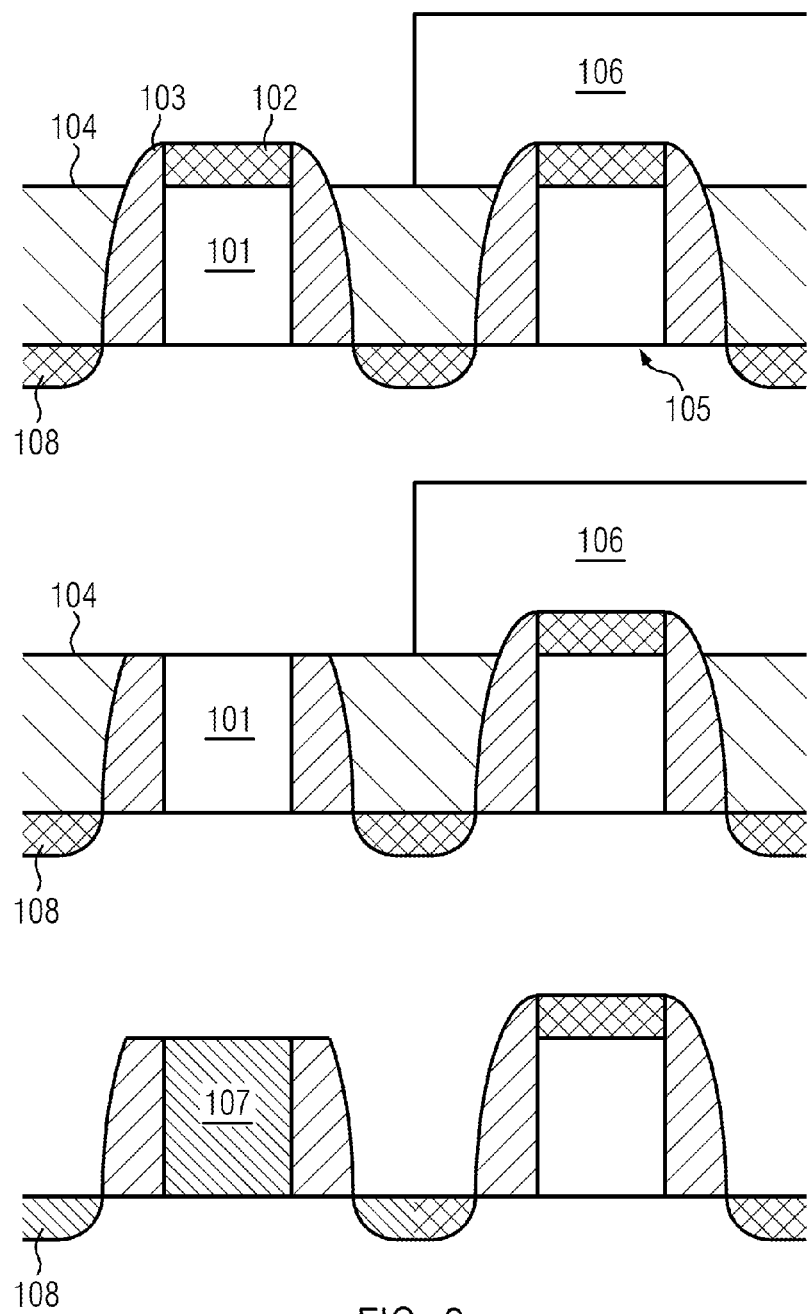
FIG. 3 illustrates a method for the formation of a silicidated polysilicon fuse in the context of integrated formation of semiconductor devices.

Formation of a silicidated polysilicon fuse within an integrated scheme of the manufacture of semiconductor devices will now be described with reference to FIG. 3. FIG. 3 shows an intermediate product similar to the one shown at the top of FIG. 1. The intermediate product comprises a "gate" 101 covered by a cap layer 102. The cap layer 102 may be a nitride layer, for example. The thickness of the cap layer 102 may be in a range of 5-15 nm. Sidewall spacers 103 are formed at both sides of the "gate" 101. The choice of the final function of the "gate" 101 is kept open at this processing stage, and, therefore, the term is used with quotation marks in this example.

The structure is formed on a semiconductor substrate that may comprise a semiconductor layer, which in turn may be comprised of any appropriate semiconductor material, such as silicon, silicon/germanium, silicon/carbon, other II-VI or III-V semiconductor compounds and the like. The semiconductor layer may comprise a significant amount of silicon due to the fact that semiconductor devices of high integration density may be formed in volume production on the basis of silicon due to the enhanced availability and the well-established process techniques developed over the last decades. However, any other appropriate semiconductor materials may be used, for instance, a silicon-based material containing other iso-electronic components, such as germanium, carbon and the like. The semiconductor substrate may be a silicon substrate, in particular, a single crystal silicon substrate. Other materials may be used to form the semiconductor substrate, such as, for example, germanium, silicon/germanium, gallium phosphate, gallium arsenide, etc. Furthermore, the substrate may define a silicon-on-insulator (SOI) configuration.

The structure shown in FIG. 3 additionally comprises another semiconductor device 105. The semiconductor substrate may comprise implanted regions in order to provide for source/drain regions, for example, depending on the actual desired final configuration.

The additional semiconductor device 105 may be a transistor, for example, an NFET or PFET. An organic planarization layer (OPL) 104 is formed both on the structure comprising the "gate" 101 and the other semiconductor device 105. After it has been formed, the OPL 104 is etched back such that an upper surface of the OPL 104 is positioned at a level that is below a level of an upper surface (free surface not in contact with the "gate" 101) of the cap layer 102. Thereby, the gate topography is leveled. The OPL 104 may comprise spin-on-carbon. Some particular examples of OPLs are ODL (commercially available from Shin-etsu Chemical, Co., Ltd) and a top coating composition known as NFC (commercially available from Japan Synthetic Rubber). For example, the OPL 104 may be a layer of CHM701B, commercially available from Cheil Chemical Co., Ltd., HM8006 and HM8014, commercially available from JSR Corporation, and ODL-102, commercially available from Shin-etsu Chemical, Co., Ltd. The OPL 104 may be formed by performing a spin-coating process and thereafter drying the OPL material. The thickness of the OPL 104 may be in the range of 100-900 nm, for example.

A patterned mask layer 106 is formed to cover the additional semiconductor device 105 and to expose the structure comprising the "gate" 101, cap layer 102 and sidewall spacers 103. The patterned mask layer 106 may be provided, for example, as a photoresist coating. After exposure of the photoresist coating by means of a suitably shaped mask and etching the exposed photoresist coating, the patterned mask layer 106 results. After back etching of the OPL 104 and change of etching chemistry, etching and/or planar back polishing is performed for removing the cap layer 102. The cap layer 102 may be removed by wet or dry etching. Removal of the protective cap layer 102 may comprise a relatively aggressive main etching process etching through most of the protective cap layer 102, followed by a relatively non-aggressive over-etch process. Only in regions exposed by the patterned mask layer 106, the cap layer 102 (hard mask) is removed.

Subsequently, as shown at the bottom of FIG. 3, both the patterned mask layer 106 and the remaining OPL 104 are stripped. It is noted that removing the cap layer 102, the patterned mask layer 106 and the OPL 104 may be carried out in a single process chamber without removing the wafer from the chamber in order to accelerate the overall processing and avoid contamination.

After removal of the patterned mask layer 106 and the remaining OPL 104, a silicidation process is carried out. The metal silicide regions may be formed on the basis of refractory metals, such as nickel, platinum and the like, that may be deposited and may be converted into a metal silicide by performing an appropriate heat treatment, for example, in the form of a rapid thermal anneal. Thereafter, any non-reacted metal material may be removed on the basis of well-established selective etch techniques, wherein additional heat treatments for stabilizing the overall characteristics may follow, if required. During the silicidation process, the spacer structures 103 may reliably cover the sidewalls of the "gate"

101, thereby avoiding significant metal wraparound such that enhanced controllability and uniformity of the silicidation process may be accomplished. The silicidation process may, for example, result in the formation of a silicidated polysilicon fuse 107. In addition, the silicidation process may result in silicidated source/drain regions 108 (in this case, source/drain implantation has been performed before the formation of the patterned mask layer 106 by using the cap layer and sidewall spacers of the semiconductor device 105 as implantation masks) of a transistor device 105. Thus, an integrated rather simple manufacturing scheme for forming a transistor device 105 and a silicidated polysilicon fuse 107 is provided.

Figure 4:
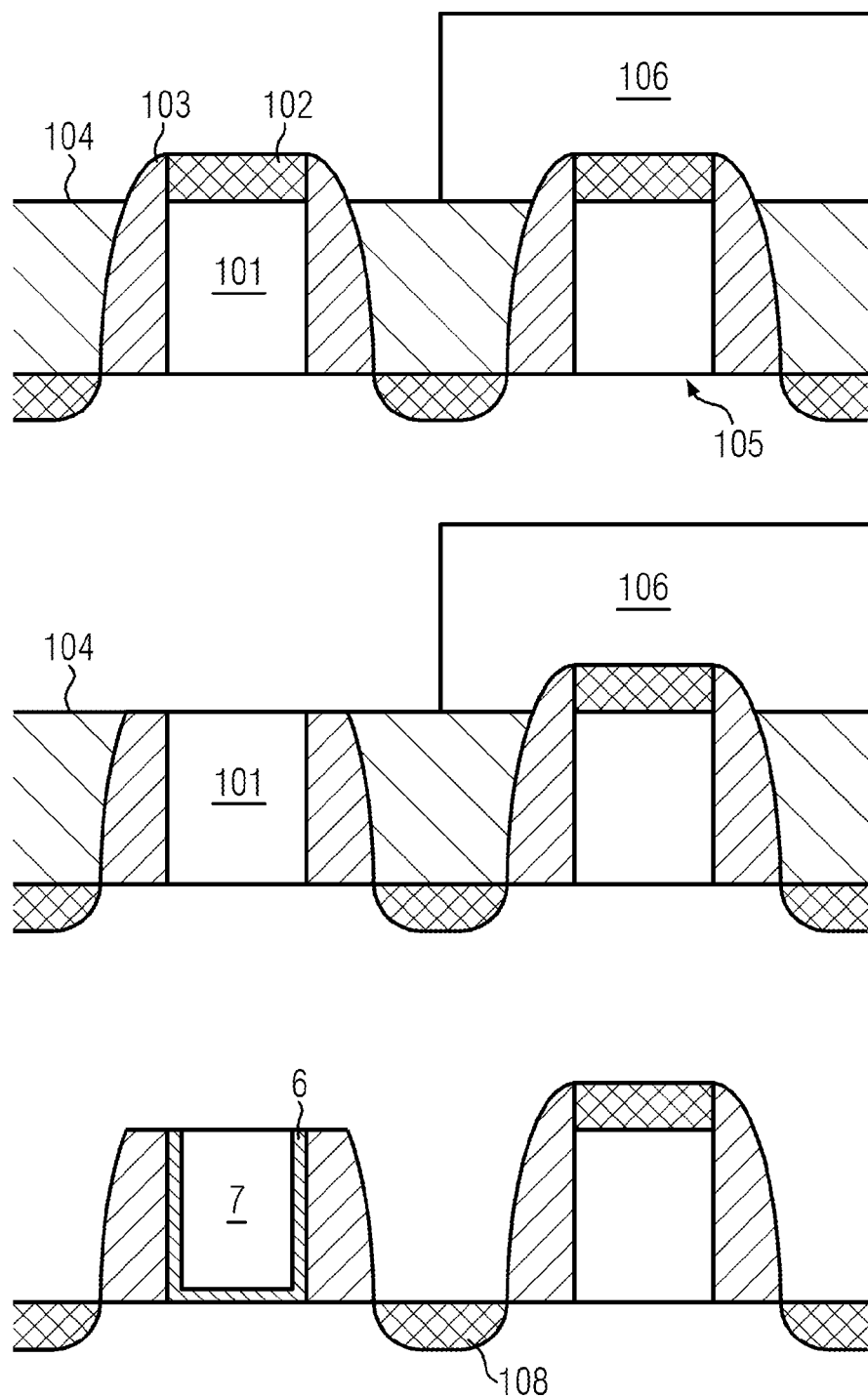
FIG. 4 illustrates a method for gate last processing according to an example of the present invention.

A further example of an integrated manufacturing scheme based on a gate last processing is illustrated in FIG. 4. According to this example, two transistor devices are formed on a semiconductor substrate. The two transistor devices may be designed as N-channel or P-channel transistors, both or one of them may be designed as a P-channel transistor whereas the other one is designed as an N-channel transistor. Source/drain regions 108 are formed adjacent to the sidewall spacers 103 and the sidewall spacers of the transistor 105 before deposition of the OPL 104 and pattered mask layer 106. After back etching of the OPL 104, a similar configuration results as it is shown in FIG. 4. However, in order to form a transistor device based on the (replacement) gate 101, it is mandatory that source/drain regions are formed adjacent to the sidewall spacers 103. If formation of a silicidated fuse is intended (see FIG. 3), such a formation of source/drain regions is not necessary, however, might result during the integrated overall processing.

Starting from the configuration shown in the middle of FIG. 4, the patterned mask layer 106 and the remaining OPL 104 are removed in order to perform a silicidation process. In principle, silicidation may be performed before or after replacing the replacement gate 101 by the material of the final gate electrode. For example, the replacement gate 101 is removed and a high-k layer 6 and electrode layer 7 (comprising metal layers and a polysilicon layer, for example) are formed in exchange for the replacement gate 101. Afterwards, silicidation is performed to achieve a silicidated gate 6 and silicidated source/drain regions 108. For example, NiSi is a good candidate for the silicidation process due to its low resistivity, low formation temperature, little silicon consumption and large stable processing temperature window.

Figure 5:
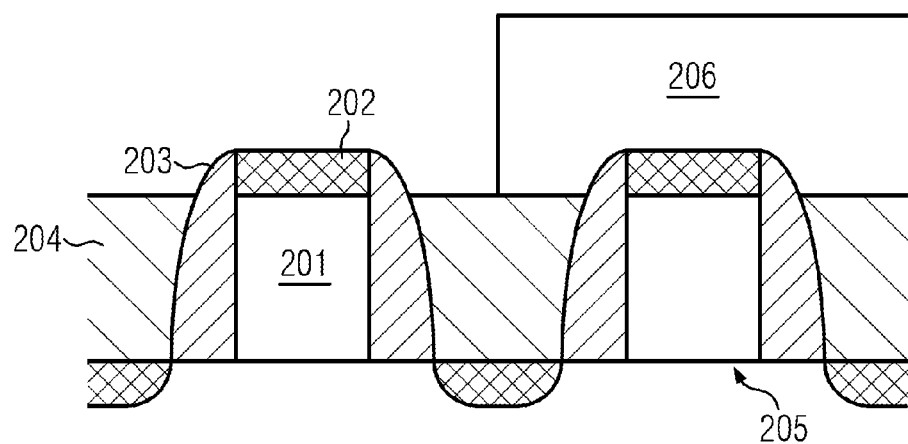
FIG. 5 illustrates a method for gate first processing according to an example of the present invention.
Figure 5:
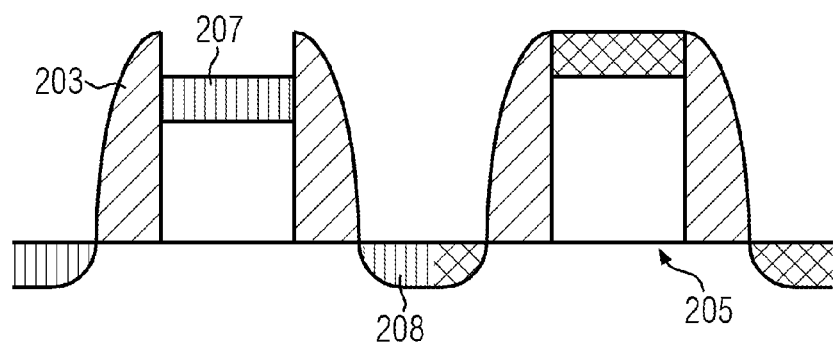

An example of the present invention comprising gate first processing (without a replacement gate) is illustrated in FIG. 5. A first structure comprising a gate 201, a cap layer 202 and sidewall spacers 203 is formed on a semiconductor substrate. The cap layer 202 may be a nitride layer, for example. The thickness of the cap layer 102 may be in a range of 5-15 nm. The gate 201 may comprise a high-k dielectric gate insulation layer and one or more metal layers, as well as a polysilicon layer. The semiconductor substrate may comprise a semiconductor layer, which in turn may be comprised of any appropriate semiconductor material, such as silicon, silicon/germanium, silicon/carbon, other II-VI or III-V semiconductor compounds and the like. The semiconductor layer may comprise a significant amount of silicon due to the fact that semiconductor devices of high integration density may be formed in volume production on the basis of silicon due to the enhanced availability and the well-established process techniques developed over the last decades. However, any other appropriate semiconductor materials may be used, for instance, a silicon-based material containing other iso-electronic components, such as germanium, carbon and the like. The semiconductor substrate may be a silicon substrate, in particular, a single crystal silicon substrate. Other materials may be used to form the semiconductor substrate, such as, for example, germanium, silicon/germanium, gallium phosphate, gallium arsenide, etc. Furthermore, the substrate may define an SOI configuration.

Moreover, a second structure 205, for example, a transistor device, is formed on the substrate. The first and second structures may represent individual examples of a group of a plurality of similar structures. Source/drain regions may be formed adjacent to the sidewall spacers 203 of the first and second structures. Ion implantation in the context of an embedded SiGe sequence may be carried out in order to form the source and drain regions, for example. An OPL 204 was formed above both structures and back-etched such that an upper surface of the OPL 204 is positioned at a level that is below a level of an upper surface of the cap layer 202. Similar to the example shown in FIG. 3, a patterned mask layer 206 is formed to cover the second structure 205 and to expose the first structure comprising the gate 201, cap layer 202 and sidewall spacers 203. The patterned mask layer 206 may be provided, for example, as a photoresist coating. After exposure of the photoresist coating by means of a suitably shaped mask and etching the exposed photoresist coating, the patterned mask layer 206 results.

Next, the cap layer 202 is removed in regions not covered by the mask layer 206 with the OPL 204 being present and protecting the source/drain regions formed adjacent to the sidewall spacers of the first and second structures.

After removal of the patterned mask layer 206 and the remaining (back-etched) OPL 204, a silicidation process is carried out. The metal silicide regions 207 and 208 may be formed on the basis of refractory metals, such as nickel, platinum and the like, that may be deposited and may be converted into a metal silicide by performing an appropriate heat treatment, for example, in the form of a rapid thermal anneal. Thereafter, any non-reacted metal material may be removed on the basis of well-established selective etch techniques, wherein additional heat treatments for stabilizing the overall characteristics may follow, if required. During the silicidation process, the spacer structures 203 may reliably cover the sidewalls of the gate 201, thereby avoiding significant metal wraparound such that enhanced controllability and uniformity of the silicidation process may be accomplished.

The silicidation process results in a silicidated gate electrode 207 and silicidated source/drain regions 208. The gate electrode of the second structure 205 is protected against silicidation by its own cap layer that was not removed during the process of removal of the cap layer 202 of the first structure. Thus, an integrated rather simple manufacturing scheme for forming a transistor device comprising a silicidated gate electrode 207 and a transistor device 205 without a silicidated gate electrode, for example, is provided. Typical channel lengths of the transistors may be below 100 nm, for example, some 50 nm.

As a result, the present disclosure provides manufacturing techniques for semiconductor devices employing silicidation processing. Particularly, the provided manufacturing techniques comprise either gate last or gate first processing. Within an efficient sequence of steps of overall integrated processing, silicidation of particular structures, while maintaining other structures free of silicidation, is achieved.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for performing silicidation of a gate electrode, comprising
    forming both a first transistor with a first gate electrode covered by a cap layer and a semiconductor device on the same semiconductor substrate;
    forming an organic planarization layer (OPL) on said first transistor and said semiconductor device;
    back etching said OPL such that an upper surface of said OPL is positioned at a level that is below a level of an upper surface of said cap layer;
    forming a mask layer covering said semiconductor device and exposing said first transistor;
    removing said cap layer while said back-etched OPL and said mask layer are present; and
    performing silicidation of said first gate electrode.

2. The method of claim 1, wherein said semiconductor device is a second transistor comprising a second gate electrode and a second cap layer protecting said second gate electrode against silicidation during silicidation of said first gate electrode.

3. The method of claim 1, wherein said semiconductor device is a resistor device.

4. The method of claim 1, further comprising forming source and drain regions of said first transistor and wherein, during silicidation of said first gate electrode, the source and drain regions of said first transistor are also silicidated.

5. The method of claim 1, further comprising removing said mask layer and said back-etched OPL before performing silicidation of said first gate electrode.

6. The method of claim 5, wherein the steps of back-etching said OPL, removing said protective cap layer, removing said back-etched OPL and said mask layer are all performed in a single process chamber without removing said semiconductor substrate from said single process chamber.

7. The method of claim 1, wherein forming said mask layer comprises forming a photoresist coating on said back-etched OPL, said first transistor and said semiconductor device and patterning said photoresist coating to expose said first transistor.

8. A method, comprising
    forming both a first structure comprising a layer comprising polysilicon covered by a cap layer and a semiconductor device on the same semiconductor substrate;
    forming an organic planarization layer (OPL) on said first structure and said semiconductor device;
    back etching said OPL such that an upper surface of said OPL is positioned at a level that is below a level of an upper surface of said cap layer;
    forming a mask layer covering said semiconductor device and exposing said first structure;
    removing said cap layer while said back-etched OPL and said mask layer are present; and
    performing a step of silicidation.

9. The method of claim 8, wherein, by performing said step of silicidation, said layer comprising polysilicon is silicidated, thereby forming a silicidated polysilicon fuse.

10. The method of claim 8, wherein said layer comprising polysilicon is a replacement gate and further comprising replacing said replacement gate by a gate electrode after removal of said cap layer.

11. The method of claim 10, wherein said first structure comprises sidewall spacers adjacent to said layer comprising polysilicon and performing said step of silicidation comprises silicidation of said gate electrode and source and drain regions that are formed adjacent to said sidewall spacers.

12. The method if claim 8, further comprising removing said mask layer and said back-etched OPL before performing said step of silicidation.

13. The method of claim 12, wherein the steps of back-etching said OPL, removing said protective cap layer, removing said back-etched OPL and said mask layer are all performed in a single process chamber without removing said semiconductor substrate from said single process chamber.

14. The method of claim 8, wherein forming said mask layer comprises forming a photoresist coating on said back-etched OPL, said first structure and said semiconductor device and patterning said photoresist coating to expose said first structure.

15. The method of claim 8, wherein said semiconductor device is a transistor comprising a second gate electrode and a second cap layer protecting said second gate electrode against silicidation during said step of silicidation.

16. The method of claim 8, wherein said semiconductor device is a resistor device.

* * * * *